US006548414B2

(12) United States Patent
Athavale et al.

(10) Patent No.: US 6,548,414 B2
(45) Date of Patent: *Apr. 15, 2003

(54) METHOD OF PLASMA ETCHING THIN FILMS OF DIFFICULT TO DRY ETCH MATERIALS

(75) Inventors: Satish D. Athavale, Fishkill, NY (US); Martin Gutsche, Dorpen (DE)

(73) Assignees: Infineon Technologies AG, Munich (DE); International Business Machines Corp., Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/396,178

(22) Filed: Sep. 14, 1999

(65) Prior Publication Data

US 2001/0053610 A1 Dec. 20, 2001

(51) Int. Cl.$^7$ ............................................ H01L 21/302
(52) U.S. Cl. ..................... 438/706; 438/714; 438/715; 438/720
(58) Field of Search ................ 438/706, 714, 438/715, 720, 725, 729

(56) References Cited

U.S. PATENT DOCUMENTS

| 5,914,851 | A | * | 6/1999 | Saenger et al. ............ 361/311 |
| 5,932,492 | A | * | 8/1999 | Hahm et al. ............... 438/737 |
| 6,008,139 | A | * | 12/1999 | Pan et al. .................. 438/730 |
| 6,008,140 | A | * | 12/1999 | Ye et al. .................... 438/714 |
| 6,010,603 | A | * | 1/2000 | Ye et al. .................... 438/714 |
| 6,010,966 | A | * | 1/2000 | Ionov ........................ 438/706 |

* cited by examiner

Primary Examiner—Robert Kunemund
Assistant Examiner—Duy-Vu Deo

(57) ABSTRACT

A method for etching material which does not readily form volatile compounds in a plasma includes providing a plasma etch chamber including a wafer electrode at an initial temperature. The wafer electrode supports a wafer, and the wafer includes a layer of the material which does not readily form volatile compounds in plasma. The wafer is bombarded with charged particles from a plasma generated in the plasma etch chamber to impart thermal energy to the wafer. A reactive gas flow is provided to react with etch products of the material. Bias power is applied to the wafer electrode to impart bombardment energy to the charged particles incident on the wafer from the plasma such that a predetermined temperature is generated on a surface of the wafer wherein the wafer electrode is maintained at about the initial temperature.

24 Claims, 5 Drawing Sheets

METHOD OF PLASMA ETCHING THIN FILMS OF DIFFICULT TO DRY ETCH MATERIALS

BACKGROUND

1. Technical Field

The present invention relates to fabrication of integrated circuits, and in particular to methods of dry etching thin films of "difficult to dry etch" materials such as Platinum, Iridium, Gold, refractory elements, transition elements, their alloys and/or compounds for the formation of structures in an integrated circuit.

2. Description of the Related Art

Plasma etching is widely used for the fabrication of microelectronic devices. In plasma etching, a wafer with a desired film to be etched is placed in a plasma environment. The reactive species (neutrals and ionized species) from the plasma react with the wafer surface material to form reaction products. The reaction products are readily removed from the wafer surface due to their highly volatile nature and are pumped away, thereby leading to etching (or removal) of the wafer surface material.

The wafer temperature is typically controlled in the less than 100 degrees C. range in conventional plasma etching, for various technological reasons. This is achieved by placing the wafer on a wafer electrode that is maintained at a desired temperature (e.g., <100 C). To facilitate the transfer of heat to or from the wafer, Helium gas pressure (or flow) is normally used on the back side of the wafer. The wafer must be clamped to hold the wafer in place during processing, to provide mechanical support to the wafer and to reduce the leakage of the Helium from the backside of the wafer to the plasma environment on the front of the wafer. Clamping is achieved either by mechanical means (using a mechanical clamp) or by using electrostatic force (using a electrostatic clamp or ESC). The wafer electrode is powered using a Bias Power supply to control the energy of ions bombarding the wafer surface.

Certain materials such as Platinum, Iridium, Gold and Copper, refractory and transition elements, their alloys and compounds do not dry etch readily in a plasma environment. This is due to the fact that these materials do not form highly volatile compounds under the conditions of conventional plasma etching. For the purpose of the discussion here, such materials are defined as "difficult to dry etch."

Attempts at dry etching these materials using physical etch conditions such as ion beam etching has been shown to result in problems. Due to the low volatility of the etch product species and their associated light sticking probability, significant amount of redeposition occurs leading to critical dimension growth or formation of fence like structures. Halogen containing volatile compounds of Platinum, Iridium, Gold and Copper, refractory and transition elements, their alloys can be formed in absence of a plasma in a purely chemical reaction at very high temperatures (for example >600 degrees C.). However, the use of heated wafer electrodes to heat the wafer to an elevated temperature (>200 degrees C.) has many disadvantages. Some of these disadvantages include the following:

(1) Since heated wafer electrodes are typically designed for elevated temperature (>200 degrees C.) service, the electrodes cannot be readily cooled down to conventional processing temperatures (<100° C.) in a short period of time (such as for use within a process recipe). As a result, a plasma etch chamber equipped with a heated wafer electrode is not compatible with other lower temperature (<100 degrees C.) processes such as ARC open etch and hard mask open etch. A separate chamber must therefore be used for any additional etch processes that operate at conventional wafer temperatures.

(2) The materials of construction for the heated electrode must be chosen very carefully to be compatible with a high vacuum plasma reaction chamber. Thermal isolation of the electrode must be achieved in addition to electrical isolation from other parts of the tool. Due to the stringent design and operation requirements of the speciality materials, the electrodes tend to be expensive and add to the cost of the tool. In addition, an electrode that is heated to elevated temperatures of >200 degrees C. requires additional safety precautions and cool-down times for maintenance.

(3) Clamping and de-clamping reliability may be an issue for electrodes operating at elevated temperatures, especially for electrostatic clamps.

Therefore, a need exists for a method for dry etching "difficult to dry etch" materials which employs electrode temperatures of less than about 100 degrees C. for an electrode equipped plasma etch chamber. A further need exists for a method for achieving high wafer temperature for dry etch processing of "difficult to dry etch" materials.

SUMMARY OF THE INVENTION

A method for etching material which does not readily form volatile compounds in a plasma, in accordance with the present invention, includes providing a plasma etch chamber including a wafer electrode at an initial temperature. The wafer electrode supports a wafer, and the wafer includes a layer of the material which does not readily form volatile compounds in plasma. The wafer is bombarded with charged particles from a plasma generated in the plasma etch chamber to impart thermal energy to the wafer. A reactive gas flow is provided to react with etch products of the material. Bias power is applied to the wafer electrode to impart bombardment energy to the charged particles incident on the wafer from the plasma such that a predetermined temperature is generated on a surface of the wafer wherein the wafer electrode is maintained at about the initial temperature.

In other methods, the step of applying bias power to the wafer electrode may include the step of selecting the bias power to reach a predetermined temperature on the wafer of greater than 200 degrees Celsius. The method may further include the step of reducing heat loss from the wafer to the wafer electrode and to wafer surroundings. The step of reducing heat loss may include the step of substantially eliminating backside cooling of the water and/or reducing a clamping force to between about 0.1 pounds to about 0.0 pounds between the wafer and the wafer electrode. The initial temperature may be about room temperature. The predetermined temperature may be greater than about 300 degrees Celsius. The method may further include the step of etching the material to form interconnect structures in an integrated circuit. The step of etching the material to form capacitor electrodes in an integrated circuit may be included. The material may include at least one Platinum, Iridium, Gold, Copper, a refractory element and a transistor element. The step of providing the reactive gas flow may include the step of providing the reactive gas flow with halogens.

A method for plasma etching a layer of at least one Platinum, Iridium, Gold Copper, a refractory element and a transistor element, in accordance with the present invention, includes forming a hard mask on the layer for providing an etch pattern on the layer, the layer being formed on a wafer, providing a plasma etch chamber including a wafer electrode at an initial temperature, securing the wafer to the wafer electrode with a clamping force of substantially zero, bombarding the wafer with charged particles from a plasma generated in the plasma etch chamber to impart thermal energy to the wafer, providing a reactive gas flow including halogens to react with the layer to form etch products of the layer and applying bias power to the wafer electrode to impart bombardment energy to the charged particles incident on the water from the plasma such that a predetermined temperature is generated on a surface of the wafer while the wafer electrode is maintained at about the initial temperature, the predetermined temperature having a value sufficient to make the etch products volatile to react with the reactive gas flow.

In other methods, the step of applying bias power to the wafer electrode may include the step of selecting the bias power to reach a predetermined temperature on the wafer of greater than 200 degrees Celsius. The step of reducing heat loss from the wafer to the wafer electrode and to wafer surroundings by substantially eliminating backside cooling of the wafer may be included. The clamping force may be between about 0.1 pounds to about 0.0 pounds between the wafer and the wafer electrode. The initial temperature may be about room temperature. The method may further include the step of etching the layer to form interconnect structures in an integrated circuit. The method may further include the step of etching the layer to form capacitor electrodes in an integrated circuit.

A method for patterning platinum electrodes for stacked capacitors for dynamic random access memory chips, in accordance with the present invention, includes providing a wafer having a layer of Platinum formed thereon, patterning a hard mask on the layer of Platinum, securing the wafer to a wafer electrode in a plasma etch chamber, the wafer electrode being at an initial temperature, bombarding the wafer with charged particles from a plasma generated in the plasma etch chamber to impart thermal energy to the wafer, providing a reactive gas flow to react to form etch products of the Platinum and to etch the Platinum in accordance with the hard mask, and applying bias power to the wafer electrode to impart bombardment energy to the charged particles incident on the wafer from the plasma such that a temperature of greater than about 200 degrees Celsius is generated on a surface of the wafer wherein the wafer electrode is maintained at about the initial temperature.

In other methods, the step of reducing heat loss from the wafer to the wafer electrode and to wafer surroundings by substantially eliminating backside cooling of the wafer may be included. The step of securing the wafer to a wafer electrode may include the step of clamping the wafer to the wafer electrodes with a clamping force between about 0.1 pounds to about 0.0 pounds. The initial temperature may be about room temperature. The hard mask may include Barium Strontium Titanium oxide (BST). The reagent gas preferably includes halogens.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention relates to fabrication of integrated circuits, and more particularly to methods of dry etching thin films of "difficult to dry etch" materials such as Platinum, Iridium, Gold, refractory elements, transition elements, their alloys and/or compounds for the formation of structures in an integrated circuit. Plasma etching is presented as a method to pattern or etch difficult to dry etch materials. These materials generally include metals, however other compounds are included which will be described in greater detail below. Some examples of etching hard to dry etch materials include platinum or iridium electrodes of stacked capacitors for semiconductor memory devices. Plasma etching of these materials is, however, difficult since these materials do not readily form highly volatile compounds under conventional plasma etch conditions.

The present invention provides a method to plasma etch films of platinum, iridium and other similar materials by using the plasma to heat the wafer to elevated temperatures (e.g., above 200 degrees C.) and to simultaneously etch the film using halogen including reactive gas mixtures, without using a high temperature (above 200 degrees C.) wafer electrode. The high wafer temperature significantly reduces redeposition of material on the wafer by lowering the sticking probability and, in some cases, increases the volatility of etch by-products. The high energy ion bombardment from the plasma and high wafer temperature facilitates high etch rates and good etch rate uniformity. Since the wafer electrode is maintained at temperatures of less 100 degrees C., the present invention is advantageously compatible with other low temperature etch processes such as ARC open and hard mask open in the same chamber.

The present invention teaches a method to dry etch thin films of "difficult to dry etch" materials such as Platinum, Iridium, Gold and Copper, refractory elements, transition elements, their alloys and/or compounds. The present invention employs the plasma to simultaneously perform (a) heating of the wafer to an elevated temperature (e.g., greater than about 200 degrees C.) and (b) dry/plasma etching of the thin film material.

Figure 1:
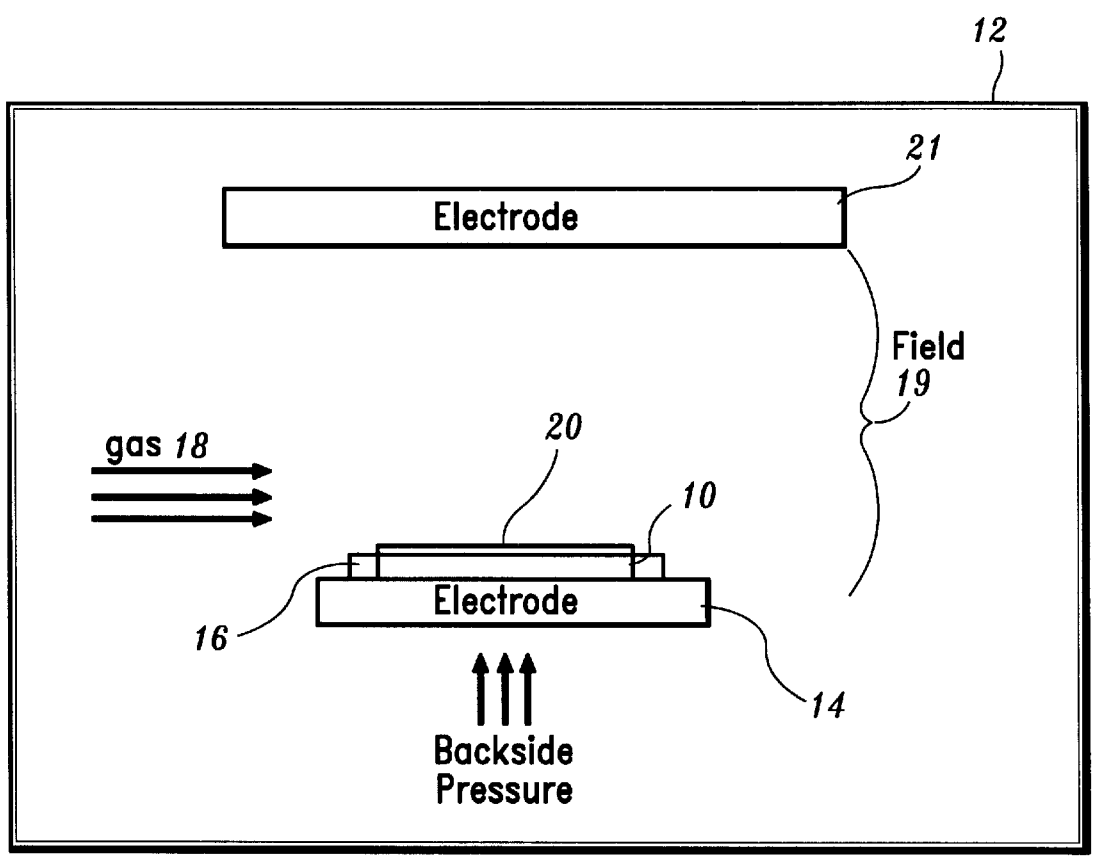
FIG. 1 is a block diagram of showing a plasma etch chamber employed in accordance with the present invention.
Figure 2:
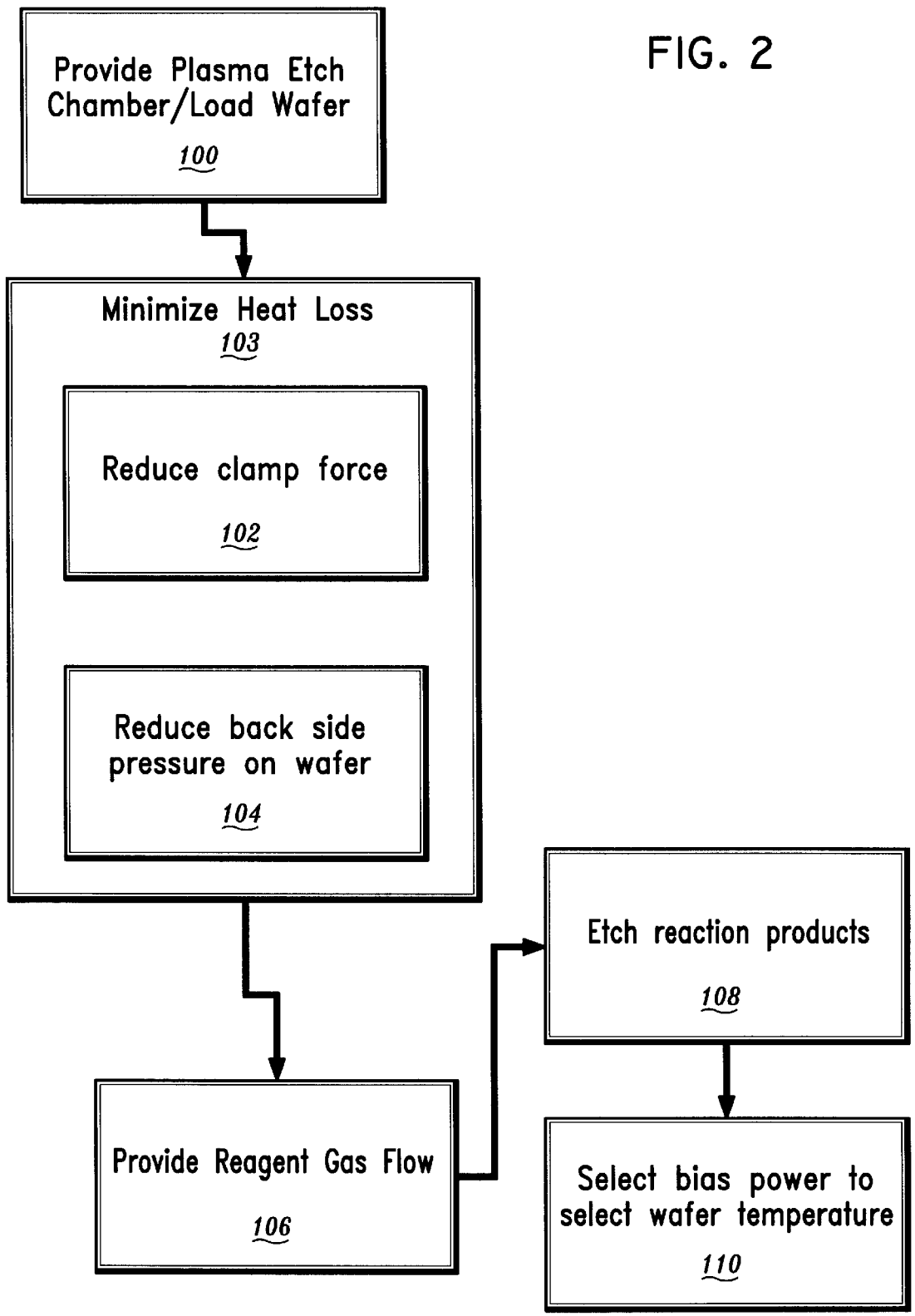
FIG. 2 is a flow diagram of one method for etching "difficult to plasma (dry) etch" materials in accordance with the present invention.

Referring now in specific detail to the drawings in which like reference numerals identify similar or identical elements throughout the several views, and initially to FIGS. 1 and 2, a wafer 10 is placed in an etch chamber 12 provided in block 100. Etch chamber 12 is preferably at about room temperature as is a wafer electrode 14. Wafer 10 is placed on wafer electrode 14 that is maintained at a temperature in a temperature range for plasma etching (e.g., less than about 100 degrees C.).

The present invention may be employed in any plasma reactor in which the plasma is excited using RF or microwave power. During plasma etching, charged species from the plasma bombard the surface of wafer 10 and exchange energy with the wafer material which manifests itself in the form of thermal energy (heat). In block 103, heat loss is minimized. This may include minimizing the heat loss from wafer 10 to wafer electrode 14 and to the surroundings by using minimal or zero backside helium cooling and using a very small clamping force on wafer. Other measures may be taken as well. In block 102, a clamp force is applied by employing chucks 16 to secure wafer 10 in place. In a preferred embodiment, an electrostatic clamp is employed, although a mechanical clamp may be used. The clamping force is set to a very small value, preferably between about 0.1 pounds to about 0 pounds. In block 104, helium pressure on a back side 14 of wafer 10 is applied. In a preferred embodiment, the helium pressure on back side 14 of wafer 10 is set to a small value, preferably between about 50 to about 0 Torr. Steps 102 and 104 ensure minimum loss or transfer of thermal energy from wafer 10 to wafer electrode 14 and to the surroundings. By doing so, most of the energy that is deposited into wafer 10 by the charged species from the plasma (and which is converted to heat) is conserved and therefore results in heating wafer 10 to an elevated temperature in a very short period of time using the charged particle bombardment from the plasma to impart thermal energy to the wafer. Elevated temperatures include temperatures of greater than about 200 degrees C. and more preferably greater than about 300 degrees C.

In block 106, a reagent gas 18 flow of halogen gases is supplied to plasma etch chamber 12. The halogen gases preferably include Fluorine, Chlorine, Bromine and/or Iodine or mixtures thereof. An applied RF or microwave field 19 between an electrode 21 and wafer electrode 14 disassociates and ionizes gas 18 to form reactive species. The reactive species from the plasma react with thin films or layers 20 formed on wafer 10. In block 108, layers 20 of difficult to plasma (dry) etch materials (e.g., Platinum) form reaction products (a thin layer of halogenated material). The high wafer temperature along with ion bombardment from the plasma facilitate the removal of the reaction products from the wafer surface. Due to the high wafer temperature, the sticking probability on the wafer surface is reduced significantly, thus reducing or eliminating completely residue or fence build-up. The high wafer temperature also facilitates high etch rate of layers 20. Advantageously, layer 20 is dry etched without etch products building up while maintaining a low wafer electrode 14 temperature. In block 110, a bias power of etch chamber 12 is selected such that the desired high wafer temperature is achieved, by applying RF or microwave power to generate a plasma and applying bias power to wafer electrode 14 to impart high bombardment energy to the ions incident on wafer 10 from the plasma. For example, a bias power of between 450 W and about 500 W may be employed to achieve temperatures of about 300 degrees C. at the surface of wafer 10.

Figure 3:
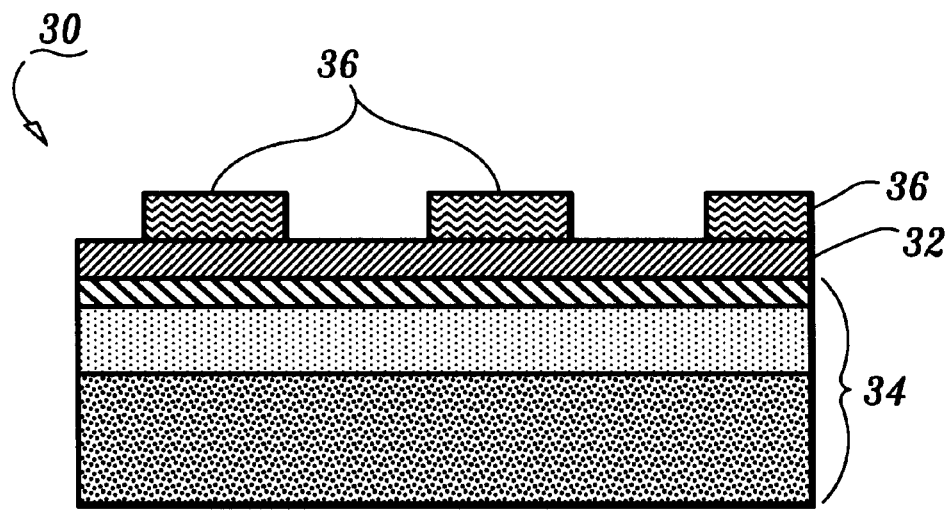
FIG. 3 is a cross-sectional view of a semiconductor device showing a hard mask patterned on a "difficult to plasma (dry) etch" material for processing in accordance with the present invention.

Referring to FIG. 3, an illustrative cross-sectional view of a semiconductor device 30 is shown. Device 30 may include a semiconductor memory device, such as a dynamic random access memory (DRAM), a processing chip, an application specific chip or any other semiconductor chip which employs difficult to dry etch materials. A layer 32 is formed on a substrate 34. Substrate 34 may include one or more layers for forming various components for device 30. Layer 32 has a mask layer 36 patterned thereon to be employed in patterning layer 32. Layer 32 may include Platinum, Iridium, Copper, Gold, transition elements, refractory elements and/or their alloys and compounds. Mask layer 36 may include one or more of silicon dioxide, silicon nitride, titanium nitride, titanium or other hard mask materials such as Barium Strontium Titanium oxide (BST).

Figure 4:
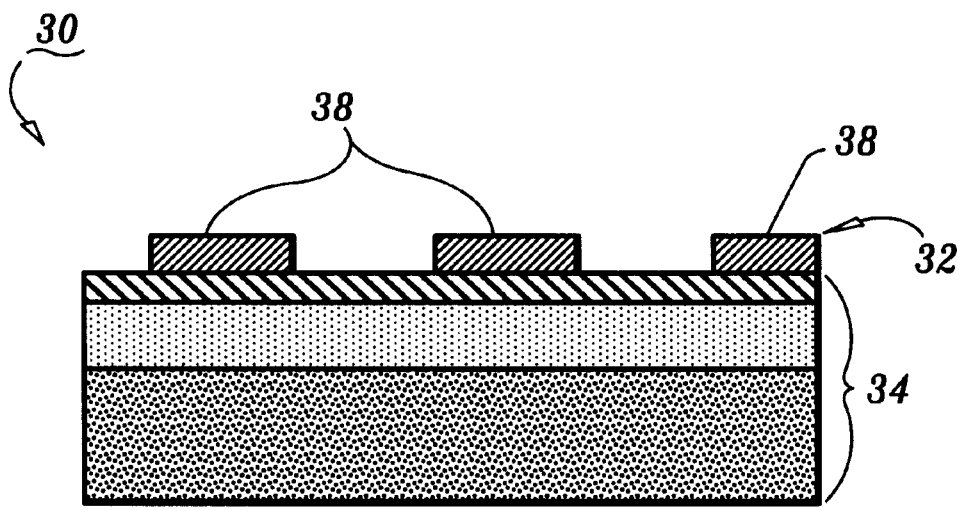
FIG. 4 is a cross-sectional view of the semiconductor device of FIG. 3 showing the "difficult to plasma (dry) etch" material plasma (dry) etched in accordance with the present invention.

Referring to FIG. 4, device 30 is subjected to a plasma etch as described above in accordance with the present invention. Exposed portion of layer 32 are dry etched to provide structures 38. Structures 38 may include conductive lines, interconnects, stacked capacitor electrodes or any other component needed for a particular device design.

Figure 5:
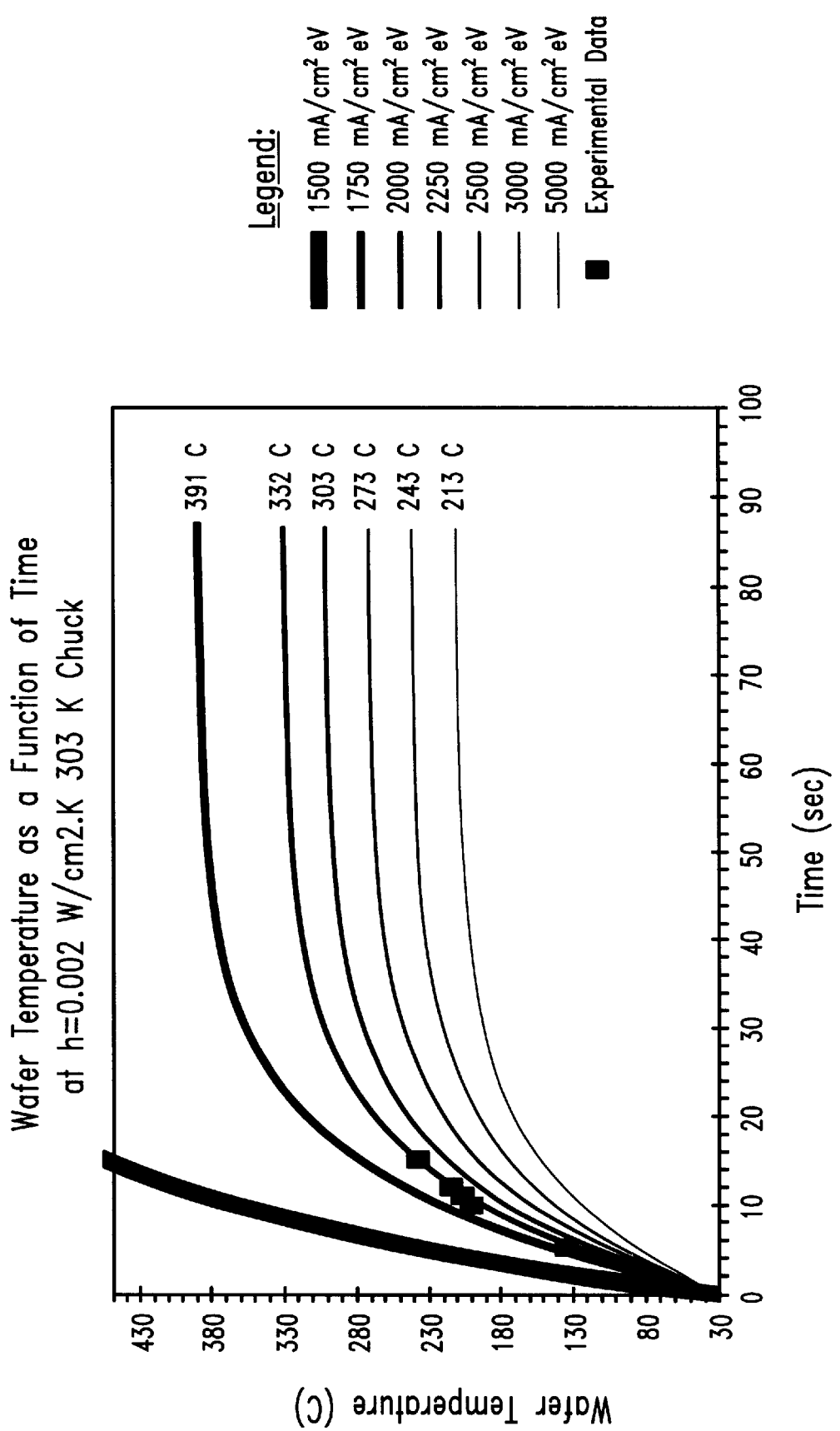
FIG. 5 is an illustrative simulation plot showing wafer temperatures as a function of bias power and time in accordance with the present invention.

Some of the advantages of the present invention include the following:

(1) High wafer temperatures (e.g. greater than 300 degrees C.) are achieved without using a high temperature wafer electrode. In fact, elevated wafer temperatures of greater than about 300 degrees C. can be achieved using a room temperature (about 25 degrees C.) electrode. Referring to FIG. 5, an illustrative plot shows experimental data along with simulation results for wafer temperature versus time. The simulation results are shown for different amounts of energy transferred from the plasma to the wafer. These amounts of energy are indicated in the legend of FIG. 5 and have units of $mA/cm^2$-eV. The simulation employs a heat transfer coefficient h equal to 0.002 $W/cm^2$-K and the chuck temperature is 303 K or 30 degrees C. Wafer surface temperatures at about steady state are indicated to the right of their respective curves.

A plasma etch reactor used in accordance with the present invention is therefore compatible with additional etch processes such as ARC (antireflection coating) open etch processes and hard mask open etch processes that operate at wafer temperatures of less than 100 degrees C.

Figure 6:
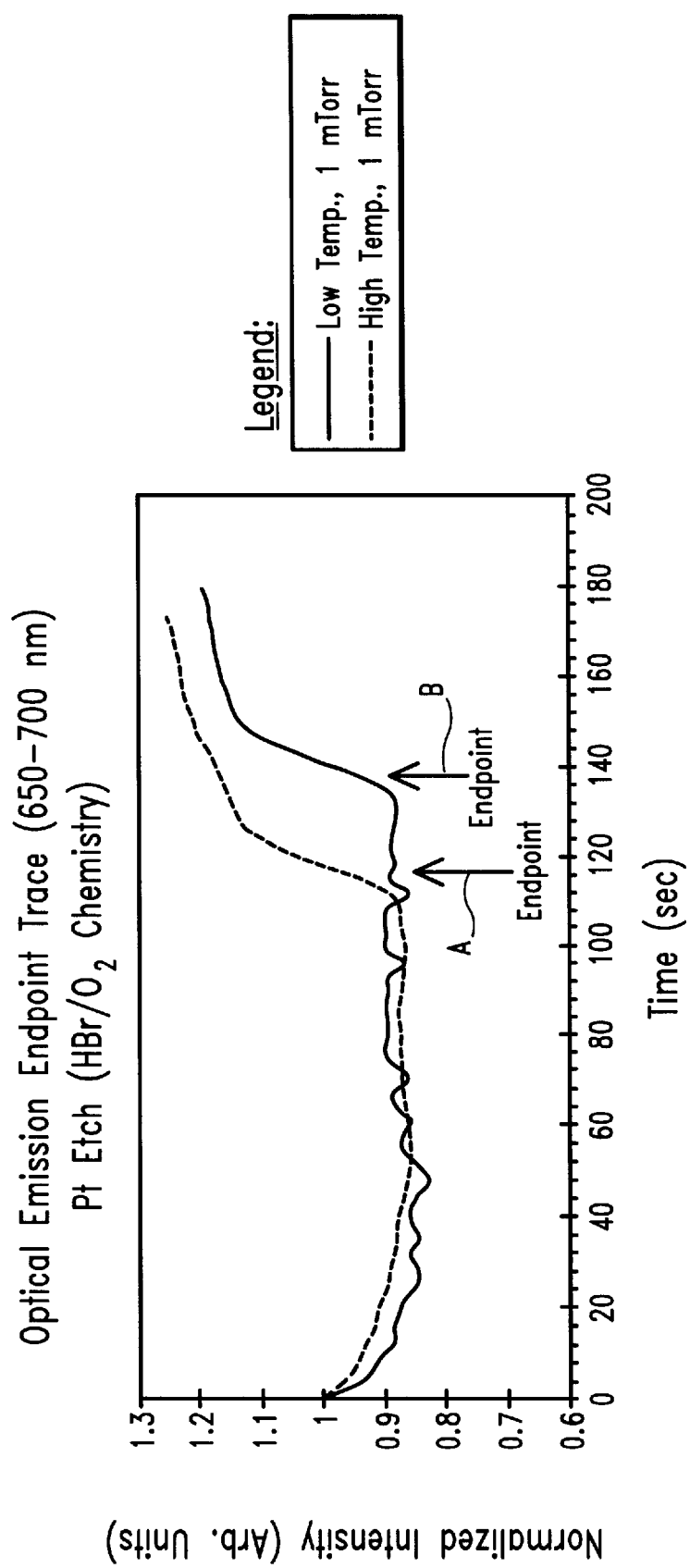
FIG. 6 is an optical emission endpoint trace comparing etch times for a high temperature process in accordance with the present invention and a low temperature etch.

(2) The high wafer temperature facilitates etch rate enhancement. In the illustrative optical endpoint trace of FIG. 6, Platinum is employed to demonstrate the improvements in etch rate for the present invention. Note that the less the endpoint time, the higher the etch rate. As indicated by arrow "A" the etch rate is 30–100% higher, depending on etch conditions than the etch rate indicated for arrow "B". As indicated in the legend of FIG. 6, a higher temperature provides a shorter end point. The present invention substantially increases the end point value by heating the wafer during processing without heating the wafer electrode. In addition, good Pt etch rate uniformity is achieved, for example, within about +/-10%. The optical emission endpoint trace employed light having a wavelength between about 650 nm to about 700 nm. The Platinum was etched using a $HBr/O_2$ chemistry.

(3) The present invention is compatible with a variety of hard mask materials for difficult to dry etch materials including $SiO_2$, $Si_3N_4$, TiN, Ti, Barium Strontium Titanium oxide (BST) etc. Experiments performed by the inventors have shown the hard mask remains intact, and there is very little redeposition of the etched materials on features.

(4) The high wafer temperature achieved using the present invention decreases sticking probability of reaction products thereby reducing the amount of redeposited material on the sidewalls of the etched feature.

(5) The approach of the present invention may be employed to etch other "difficult to plasma (dry) etch"

materials such as Iridium, Gold and Copper, refractory elements, transition elements, their alloys and/or compounds.

The present invention is particularly useful for patterning Platinum bottom electrodes of stacked capacitors for DRAM chips. However, the present invention may be applied industry-wide to etch other materials that do not readily form highly volatile compounds in a plasma such as Copper, Iridium, refractory and transition metals and their alloys.

Having described preferred embodiments for a method of plasma etching thin films of difficult to dry etch materials (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for etching material which does not readily form volatile compounds in a plasma comprising the steps of:
   providing a plasma etch chamber including a wafer electrode at an initial temperature of less than about 100 degrees Celsius, the wafer electrode for supporting a wafer, the wafer including a layer of the material which does not readily form volatile compounds in plasma;
   securing the wafer to the wafer electrode with a clamping force of substantially zero;
   bombarding the wafer with charged particles from a plasma generated in the plasma etch chambers to impart thermal energy to the wafer;
   reducing loss of the thermal energy from the wafer to the wafer electrode and to wafer surroundings including substantially eliminating backside cooling of the wafer electrode;
   providing a reactive gas flow comprising a halogen to react with material to form etch products; and
   applying bias power to the wafer electrode to impart bombardment energy to the charged particles incident on the wafer from the plasma such that a temperature higher than the initial temperature is generated on a surface of the wafer wherein the wafer electrode is maintained at about the initial temperature of less than about 100 degrees Celsius wherein a combination of the steps of reducing loss of the thermal energy and applying bias power increases volatility of the etch products to improve an etch rate of the material.

2. The method as recited in claim 1, wherein the step of applying bias power to the wafer electrode includes the step of selecting the bias power to reach a temperature on the wafer of greater than 200 degrees Celsius.

3. The method as recited in claim 1, wherein the step of reducing heat loss includes the step of maintaining a backside pressure of less than about 50 Torr on the wafer.

4. The method as recited in claim 1, wherein the step of reducing heat loss includes the step of reducing a clamping force to between about 0.1 pounds to about 0.0 pounds between the wafer and the wafer electrode.

5. The method as recited in claim 1, wherein the initial temperature is about room temperature.

6. The method as recited in claim 1, wherein the higher temperature is greater than about 300 degrees Celsius.

7. The method as recited in claim 1, further comprising the step of etching the material to form interconnect structures in an integrated circuit.

8. The method as recited in claim 1, further comprising the step of etching the material to form capacitor electrodes in an integrated circuit.

9. The method as recited in claim 1, wherein the material includes at least one of Platinum, Iridium, Gold, Copper, a refractory element and a transition element.

10. The method as recited in claim 1, wherein the step of providing a reactive gas flow includes the step of providing the reactive gas flow with at least one of chlorine, fluorine, iodine, and bromine.

11. A method for plasma etching a layer of at least one of Platinum, Iridium, Gold, Copper, a refractory element and a transition element comprising the steps of:
    forming a hard mask on the layer for providing an etch pattern on the layer, the layer being formed on a wafer;
    providing a plasma etch chamber including a wafer electrode at an initial temperature of less than about 100 degrees Celsius;
    securing the wafer to the wafer electrode with a clamping force of substantially zero;
    bombarding the wafer with charged particles from a plasma generated in the plasma etch chamber to impart thermal energy to the wafer;
    reducing loss of the thermal energy from the wafer to the wafer electrode and wafer surroundings including substantially eliminating backside cooling of the wafer electrode;
    providing a reactive gas flow comprising a halogen to react with material to form etch products; and
    applying bias power to the wafer electrode to impart bombardment energy to the charged particles incident on the wafer from the plasma such that a temperature higher than the initial temperature is generated on a surface of the wafer wherein the wafer electrode is maintained at about the initial temperature of less than about 100 degrees Celsius, the temperature having a value sufficient to make the etch products volatile to react with the reactive gas flow wherein a combination of the steps of reducing loss of the thermal energy and applying bias power increases volatility of the etch products to improve an etch rate of the material.

12. The method as recited in claim 11, wherein the step of applying bias power to the wafer electrode includes the step of selecting the bias power to reach a temperature on the wafer of greater than 200 degrees Celsius.

13. The method as recited in claim 11, wherein the loss of the thermal energy from the wafer to the wafer electrode and to wafer surroundings is reduced by maintaining a backside pressure of less than about 50 Torr on the wafer.

14. The method as recited in claim 13, wherein the clamping force is between about 0.1 pounds to about 0.0 pounds between the wafer and the wafer electrode.

15. The method as recited in claim 11, wherein the initial temperature is about room temperature.

16. The method as recited in claim 11, further comprising the step of etching the layer to form interconnect structures in an integrated circuit.

17. The method as recited in claim 11, further comprising the step of etching the layer to form capacitor electrodes in an integrated circuit.

18. A method for patterning platinum electrodes for stacked capacitors for dynamic random access memory chips comprising the steps of:

providing a wafer having a layer of Platinum formed thereon;

patterning a hard mask on the layer of Platinum;

securing the wafer to a wafer electrode with a clamping force of substantially zero in a plasma etch chamber, the wafer electrode being at an initial temperature of less than about 100 degrees Celsius;

bombarding the wafer with charged particles from a plasma generated in a plasma etch chamber to impart thermal energy to the wafer;

reducing loss of the thermal energy from the wafer to the wafer electrode and wafer surroundings including substantially eliminating backside cooling of the wafer electrode;

providing a reactive gas flow including halogen to react to form etch products of the Platinum and to etch the Platinum in accordance with the hard mask; and applying bias power to the wafer electrode to impart bombardment energy to the charged particles incident on the wafer from the plasma wherein a combination of the steps of reducing the thermal energy and applying bias power generates a temperature of greater than about 200 degrees Celsius on a surface of the wafer wherein the wafer electrode is maintained about the initial temperature of about less than 100 degrees Celsius.

19. The method as recited in claim 18, further comprising the step of reducing heat loss from the wafer to the wafer electrode and to wafer surroundings by maintaining a backside pressure of less than about 50 Torr on the wafer.

20. The method as recited in claim 19, wherein the step of securing the wafer to a wafer electrode includes the step of clamping the wafer to the wafer electrodes with a clamping force between about 0.1 pounds to about 0.0 pounds.

21. The method as recited in claim 18, wherein the initial temperature is about room temperature.

22. The method as recited in claim 18, wherein the hard mask include Barium Strontium Titanium oxide (BST).

23. The method as recited in claim 18, wherein the reactive gas flow includes at least one of chlorine, fluorine, iodine, and bromine.

24. The method as recited in claim 11, wherein the reactive gas flow includes at least one of chlorine, fluorine, iodine, and bromine.

* * * * *

UNITED STATES PATENT AND TRADEMARK OFFICE
CERTIFICATE OF CORRECTION

PATENT NO. : 6,548,414 B2
DATED : April 15, 2003
INVENTOR(S) : Satish D. Athavale and Martin Gutsche It is certified that error appears in the above-identified patent and that said Letters Patent is hereby corrected as shown below:

<u>Title page,</u>
Item [73], please correct the Assignees' name from
"International Business Machines Corp." to
-- International Business Machines Corporation --.

Signed and Sealed this

Twenty-second Day of July, 2003

JAMES E. ROGAN
*Director of the United States Patent and Trademark Office*